United States Patent [19]

Bert

[11] 4,327,339

[45] Apr. 27, 1982

[54] SOLID STATE MICROWAVE SOURCE AND RADIO EQUIPMENT INCORPORATING SUCH A SOURCE

[75] Inventor: Alain Bert, Paris, France

[73] Assignee: Thomson-CSF, Paris, France

[21] Appl. No.: 136,400

[22] Filed: Apr. 1, 1980

[30] Foreign Application Priority Data

Apr. 6, 1979 [FR] France ............................ 79 08790

[51] Int. Cl.³ ............................................. H03B 9/12
[52] U.S. Cl. .................................. 331/107 P; 331/56;
331/107 DP
[58] Field of Search ...... 331/107 P, 107 DP, 107 SL, 331/56, 96

[56] References Cited

U.S. PATENT DOCUMENTS

| | | | |
|---|---|---|---|
| 3,555,444 | 1/1971 | Hines | 331/107 DP X |
| 3,568,110 | 3/1971 | Ivanek | 331/96 |
| 3,593,186 | 7/1971 | Dench | 331/56 X |
| 3,611,192 | 10/1971 | Swartz | 331/107 DP X |
| 3,621,462 | 11/1971 | Hammer et al. | 331/107 DP X |
| 3,684,901 | 8/1972 | Kroger | 331/107 P X |
| 3,984,788 | 10/1976 | Peyrat | 331/56 X |

*Primary Examiner*—Stanley T. Krawczewicz
*Attorney, Agent, or Firm*—Roland Plottel

[57] ABSTRACT

A solid state microwave source placed within a rectangular waveguide, whose one end is short-circuited. The microwave source incorporates a negative resistance diode system placed on the inner wider wall of the waveguide and perpendicularly with respect to the waveguide transmission direction, a resonant microband line suspended by means of a dielectric substrate, a connecting means between the diode system and the resonant line, and means for connecting to an external polarization source.

9 Claims, 12 Drawing Figures

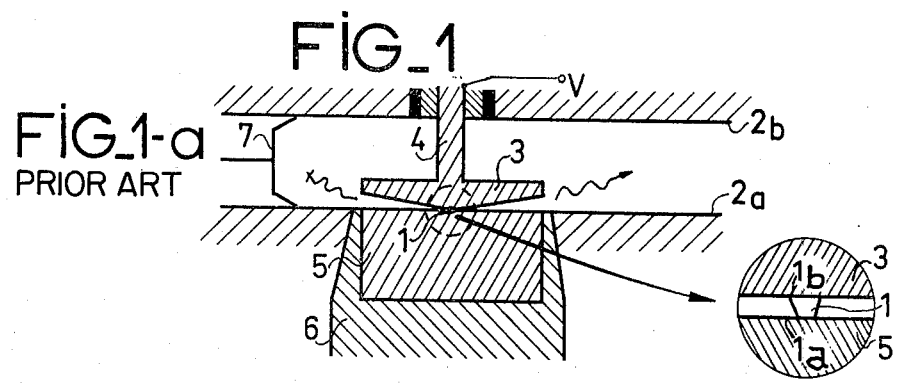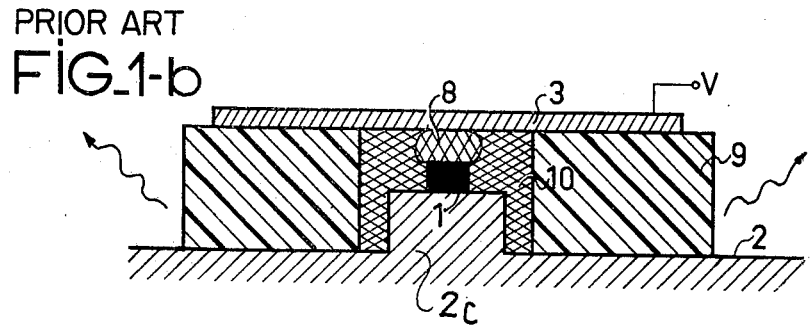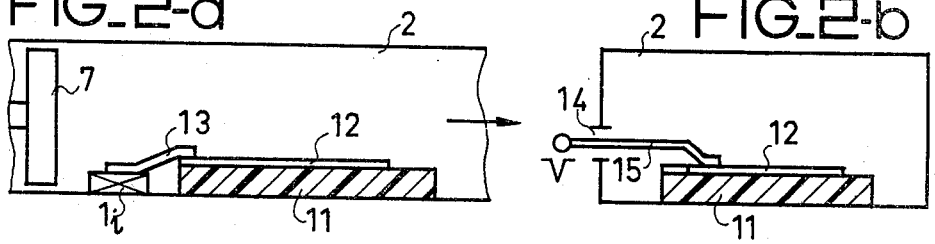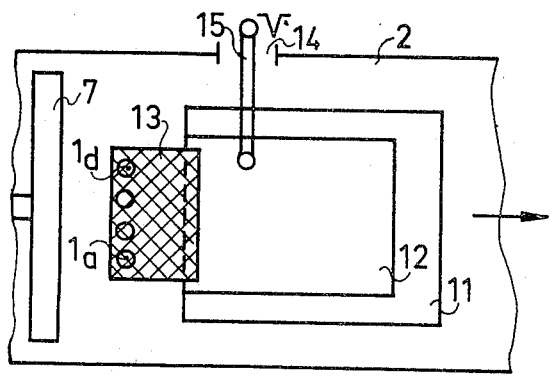

FIG_3
FIG_3-a
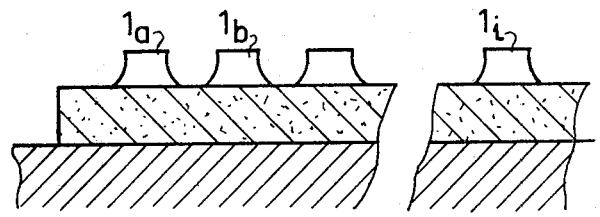
FIG_3-b
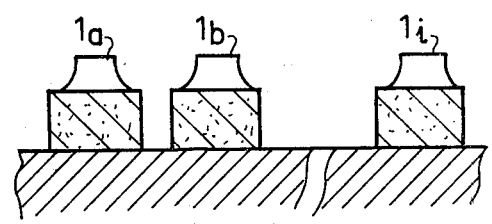
FIG_5
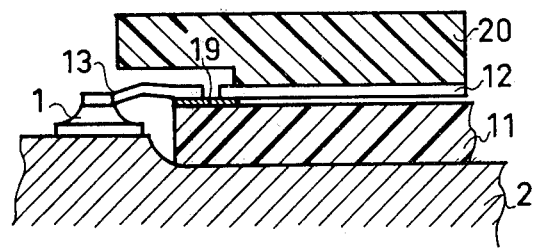
FIG_6
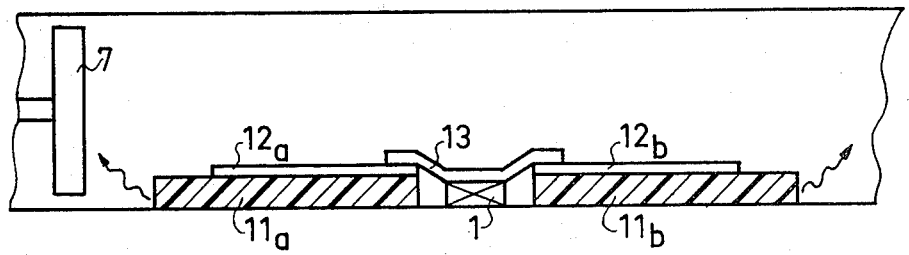

FIG_4
FIG_4-a
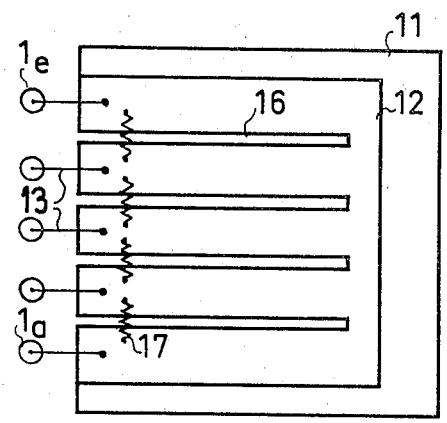
FIG_4-b
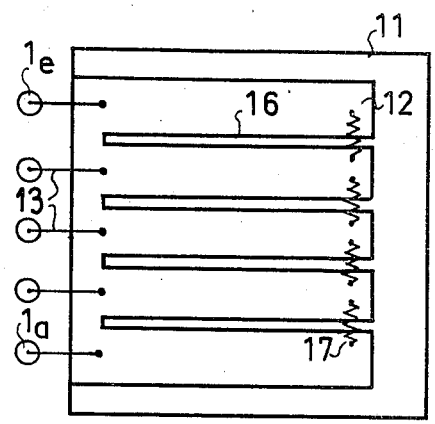
FIG_4-c
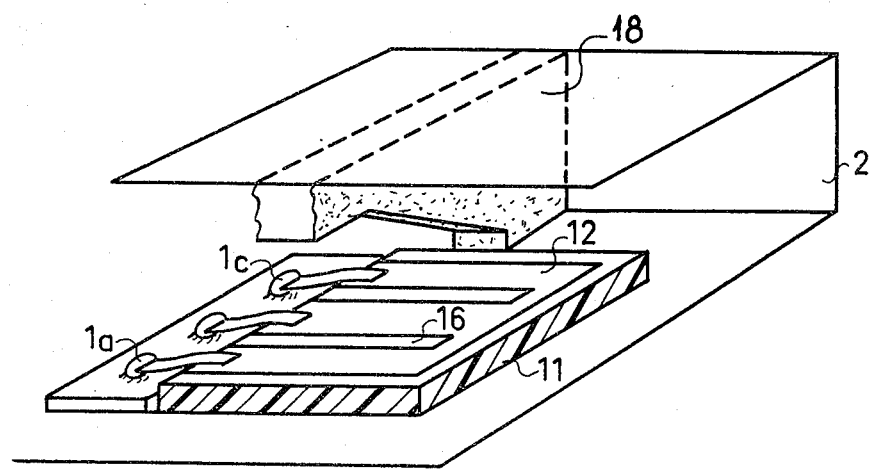

SOLID STATE MICROWAVE SOURCE AND RADIO EQUIPMENT INCORPORATING SUCH A SOURCE

BACKGROUND OF THE INVENTION

The invention relates to a solid state microwave source of the type incorporating a plurality of negative resistance diodes operating in parallel and in particular to such a source able to operate in millimeter wave bands.

The extreme frequency bands of the radiofrequency spectrum corresponding to millimeter and submillimeter wavelengths can be used for transmitting electrical signals characterised by a high information flow or a wide band. In addition, the waves in these extreme frequency bands at least over a short distance facilitate the construction of discrete links. Solid state microwave sources are known in which the active element is either an FET (field effect) transistor or a GUNN-type diode and more generally of the IMPATT type in the higher frequency bands. The output power supplied by these active elements decreases relatively rapidly when the oscillation frequency increases. For example, in the case of IMPATT diodes, the unitary output powers are approximately a few watts at 15 GHz, 1 watt at 50 GHz, 150 mW at 90 GH and 3.5 mW to 150 GHz.

These output power levels are below what is required by users. Thus, the solution of the problem of providing microwave sources with a higher power level consists of combining a plurality of active elements which have to oscillate synchronously In the case of microwave transmission lines it is known that a rectangular waveguide has minimum transmission losses per unit of length, accompanied by minimum leaks. It is of interest to utilize these properties by providing microwave sources within a standard waveguide.

In order to obtain a high output power from an IMPATT diode it is desirable to use a maximum junction surface area. Thus, the diode impedance is one or two orders of magnitude below the characteristic impedance of the transmission waveguide. Therefore, an impedance transformation ratio is necessary between these two impedances of very different values. In a typical case, it is necessary to pass from an impedance of several hundred ohms to an impedance of a few ohms to obtain correct matching. This problem is exacerbated when it is necessary to combine a plurality of diodes in parallel.

Matching methods used in centimeter frequency bands are available. However, they cannot be extrapolated into millimeter frequency bands due to the mechanical precision required and the difficulties of fitting into a waveguide with a very small cross-section.

T.MISAWA has already proposed in the Journal IEEE Trans. MTT, November 1970 a microwave oscillator construction comprising a single IMPATT diode welded to the largest inner wall of a waveguide. This diode is covered by a disk kept under a mechanical pressure. The radius of this disk is approximately a quarter of the wavelength and the part of the disk in contact with the diodes has a slight conicity.

A different construction was proposed by G. CACHIER et al. (1977 ISSC Conf. Digest pp. 126-127) in which the diode is welded to a metal connecting piece and the opposite face of the said diode receives a gold ball. The assembly constituted by the connecting piece, the diode and the ball is surrounded by an annular torus made from a dielectric material. The free space between this assembly and the annular torus is filled with a dielectric resin. Finally, the upper face of this assembly receives a metal disk deposited in the form of a metal coating.

Neither of these two constructions is suitable for the combining of a plurality of diodes, due to their axial configuration. Moreover, these constructions are not matched to the rectangular characteristic of a waveguide.

BRIEF SUMMARY OF THE INVENTION

The problem of the invention is to provide a microwave oscillator construction which is particularly suitable for the grouping of a plurality of diodes operating in a synchronous manner and which can be effectively coupled to a rectangular waveguide.

According to the invention, this problem is solved by a microwave source which comprises a system of diodes aligned perpendicularly to the transmission direction of the waveguide, a resonant microband line of the "suspended" type facing the system of diodes, an electrical connection means between the diode system and the resonant microband line and a connecting means between the diode system and an external polarization source.

According to a constructional variant, the oscillator incorporates two symmetrically arranged identical resonant lines on either side of the diode system.

The grouping of a plurality of diodes can give rise to interfering transversal modes which interfere with the normal operation of the source. The source according to the invention can incorporate means making it possible to eliminate or at least adequately reduce these transversal modes, said means being constituted by longitudinal slots made in the resonant line.

Finally, during the construction of the source, account must be taken of the low efficiency level of the presently available diodes. This efficiency is only a few percent. The various diode assembly means combine to ensure the thermal dissipation of said diodes and in particular the assembly base thereof which can be constituted by the wall of the waveguide.

BRIEF DESCRIPTION OF THE DRAWINGS

The invention is described in greater detail hereinafter relative to non-limitative embodiments and the attached drawings, wherein there is shown:

FIG. 1a a microwave oscillator installed within a rectangular waveguide in accordance with the prior art.

FIG. 1b a microwave oscillator of the "pretuned module" type according to the prior art.

FIGS. 2a, 2b and 2c a lateral view, a transverse view and a plan view respectively of an embodiment of the solid state microwave source according to the invention.

FIG. 3a a system of physical integral diodes.

FIG. 3b a system of physical independent diodes.

FIGS. 4a, 4b and 4c means making it possible to attenuate the transversal modes, said means being constituted by longitudinal slots made in the resonant line.

FIG. 5 a constructional variant of the microwave source of FIGS. 3a, 3b and 3c.

FIG. 6 another constructional variant of the microwave source of FIGS. 3a, 3b and 3c.

DETAILED DESCRIPTION OF THE PREFERRED EMBODIMENTS

FIG. 1a is a sectional view of a microwave oscillator mounted within a standard rectangular waveguide according to the prior art. This source comprises an active element 1, constituted by a single IMPATT diode. This diode is placed on the larger inner wall 2a of a standard rectangular waveguide and is covered by a disk 3. The radius of the disk is substantially equal to a quarter of the wavelength and the surface area of said disk adjacent to the diode has a conicity of approximately 10 degrees. This disk is supported by a rod 4 which traverses the opposite part 2b of the waveguide. This rod is jointly used for providing the connection with the external polarization source V. In the embodiment shown here, the elements 5 and 6 are detachable which facilitates changing the diode. Electrode 1a of the diode is welded to member 5, whilst electrode 1b is maintained in contact with the disk by mechanical pressure. Finally, one of the ends of the waveguide is closed by a sliding short-circuiter 7.

FIG. 1b shows a microwave source of the "pretuned module" type in accordance with the prior art. As hereinbefore, this source comprises an active element 1 constituted by a single diode. This diode is mounted on a connecting piece 2c fixed to a metal support 2. It is surmounted by a ball 8 or a stud made from gold, whose size significantly exceeds that of the diode. The connecting piece/diode/stud assembly is surrounded by an annular torus 9 made from quartz (molten silica) which rests on metal support 2. The free space 10 within the annular torus is filled with a dielectric material, whose dielectric constant is substantially the same as that of the quartz, for example a polyimide resin. A metal disk 3 is placed on the surface of the dielectric materials and its radius is substantially equal to quarter the wavelength. It can be obtained by a metallization process. The choice of the parameter values and particularly the disk radius fixes the oscillation frequency of the thus formed microwave source.

FIG. 2a is a lateral view of the source according to the invention. It comprises a rectangular waveguide 2, whereof one of the ends is shortcircuited by a sliding or non-sliding contact 7 and whose opposite end can incorporate a connecting flange (not shown). It also comprises a plurality of active elements aligned perpendicularly to the transmission direction of the waveguide indicated by an arrow. Only the active element 1 of order i is shown. It also comprises a resonant line of the suspended microband type having a dielectric substrate 11 arranged on the inner wall of the waveguide and a metal coating 12, said resonant line being of the quarter wavelength type. Finally, the source comprises a low inductance connecting means 13.

FIG. 2b is a cross-section through the source and shows an embodiment of the connection making it possible to polarize the active elements. A passage 14 is made in one of the smaller walls of the waveguide. This passage is traversed by a connection 15, whose one end is welded to the metal coating 12 and whose other end is connected to the external polarization source V.

FIG. 2c is a plan view of the microwave source and shows certain constructional details. Connection 13 between active elements 1a to 1d can be constituted by a grid plate made from gold making it possible to obtain a very small inductance value for the connection. The dimensions of substrate 11 can be slightly larger than those of the metal coating 12.

In a microwave source of the type described hereinbefore, the active elements can be constituted by IMPATT diodes. The dielectric substrate 11 of the resonant line can be made from a material such as quartz or molten silica.

The methods for the manufacture of such a microwave source are known to the microelectronics expert and comprise e.g. photolithography, gold deposition and welding by thermocompression.

FIG. 3a shows an embodiment of the active elements in a monolithic form. Diodes 1a to 1n are integrated in a semiconductor substrate, such as silicon or gallium arsenide (AsGa) and are physically dependent in order to increase the number of diodes per unit of length and reduce the manufacturing costs.

FIG. 3b shows a more conventional embodiment of the active elements in which the various diodes are physically independent and which makes it possible, for example, to select the diodes having the most closely related characteristics.

The combining in parallel of a large number of diodes can give rise to transversal modes and produce interfering oscillations which interfere with the operating mode of the source. Longitudinal slots can be made in the metal coating of the resonant microband line to eliminate or at least reduce these transversal modes.

FIG. 4a shows a first embodiment of the longitudinal slot 16. There are (n−1) slots, if n is the number of diodes, and they are short-circuited at the end opposite to the system of diodes 1a to 1n, and opened at the other end. These slots, which have a length of approximately a quarter wavelength, constitute resonant disturbances, thus rejecting the transversal modes into frequency bands where they no longer interfer. However, when these transversal modes are at frequencies for which the diodes still have a negative resistance, they can be damped by the insertion of resistive elements 17 deposited on the dielectric substrate 11 near the open end of the slots. In this case, connection 13 can advantageously be of the tape type.

FIG. 4b shows a second embodiment of the longitudinal slot 16 in which the respective positions of the short-circuited ends of the slots and the resistive elements 17 are reversed, with regard to the diodes.

FIG. 4c shows an embodiment which differs from that of FIGS. 4a and 4b making it possible to greatly reduce the interfering transversal modes. According to this embodiment, the residual transversal waves are absorbed in charge 18 extending in a cross section of the waveguide above the open ends of slots 16. This charge 18 can be made from a material such as that known under the trade mark ECCOSORB, marketed by the U.S. Company EMERSON and CUMING.

FIG. 5 shows a variant embodiment of FIG. 3a which makes it possible to more easily modify the dimensions of the resonant microwave line and consequently the oscillation frequency of the source.

FIG. 5 once again has the active element 1, the dielectric substrate 11 in contact with the wall of waveguide 2, the connection 13 between the system of diodes and a small metal coating 19 deposited on the dielectric substrate. The coating 12 is applied on another insulating support 20 positioned above the substrate 11 and in intimate contact with coating 19. Support 20 can be made from a dielectric material such as Teflon.

FIG. 6 shows a construction of the microwave source according to the invention in which two resonant microband lines 11a, 12a and 11b, 12b are arranged symmetrically with respect to the diode system. Although this microwave source construction is more complex, it makes it possible to reduce by a factor of 2 the impedance transformation between the diodes and the line. It also increases the efficiency of the sliding short-circuiter.

The invention is not limited to the embodiments described and the gold grid plate providing the connection between the diode system and the resonant line can be replaced by independent tapes. The metal base constituted by the inner wall of the waveguide can be replaced by a metal base plate.

The microwave source integrated into a rectangular waveguide can be modified for other applications, for example to antennas. Thus, it is possible to increase the size of the dielectric substrate and to deposit on the latter a microband transmission line coupled in a capacitive manner to the resonant line of the oscillator and to connect the transmission line to a radiating element.

The advantages resulting from a microwave source according to the invention are now more apparent. The longitudinal construction makes it possible to ensure an effective coupling with the waveguide and facilitates the fitting of the diodes. The manufacture of such a source only utilizes known technical methods.

A solid state microwave source can be used in wideband telecommunications systems, short range, high resolution radar systems, short range rockets, missile guidance equipments and in more general terms to radio equipment.

What is claimed is:

1. A solid state microwave source incorporating a plurality of negative resistance diodes arranged within a transmission waveguide, whose one end is closed by a short-circuiter, comprising a system of diodes aligned along one of the wider inner walls of the waveguide and perpendicularly to the transmission direction of the waveguide, at least one quarter wavelength resonant microband line suspended by means of a dielectric substrate placed on the waveguide wall and facing the system of diodes, a very low inductance connection means between the diode system and the resonant line and means for connecting the diode system with a d.c. polarization voltage source.

2. A microwave source according to claim 1, wherein the different diodes are physically independent.

3. A microwave source according to claim 1, wherein the system of diodes is formed by physical dependent diodes.

4. A microwave source according to claim 1, wherein the resonant microband line has longitudinal slots short-circuited at one of their ends.

5. A microwave source according to claim 4, wherein the slots made in the resonant line are short-circuited at the end facing the diode system.

6. A microwave source according to claim 4, wherein slots made in the resonant line are short-circuited at the end opposite to the diode system.

7. A microwave source according to claims 5 or 6, wherein dissipative resistive elements are placed at the open ends of the slots.

8. A microwave source according to claim 1, wherein the connecting means between the diode system and the suspended resonant line is constituted by a grid plate made from gold wires.

9. A microwave source according to claims 5 or 6, wherein an absorbing charge is located in a cross-section of said waveguide above the open ends of said slots.

* * * * *